US011543189B2

United States Patent
Tochigi et al.

(10) Patent No.: US 11,543,189 B2
(45) Date of Patent: Jan. 3, 2023

(54) HEAT SINK

(71) Applicant: Furukawa Electric Co., Ltd., Tokyo (JP)

(72) Inventors: Yasuyuki Tochigi, Tokyo (JP); Masahiro Meguro, Tokyo (JP); Hiroshi Sakai, Tokyo (JP); Kenya Kawabata, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 164 days.

(21) Appl. No.: 16/935,164

(22) Filed: Jul. 21, 2020

(65) Prior Publication Data
US 2020/0355443 A1 Nov. 12, 2020

Related U.S. Application Data

(63) Continuation of application No. PCT/JP2019/003084, filed on Jan. 30, 2019.

(30) Foreign Application Priority Data
Jan. 31, 2018 (JP) .............................. JP2018-015334

(51) Int. Cl.
*F28D 15/02* (2006.01)

(52) U.S. Cl.
CPC ....... *F28D 15/0275* (2013.01); *F28D 15/025* (2013.01); *F28D 15/0241* (2013.01); *F28D 15/0266* (2013.01); *F28F 2215/08* (2013.01)

(58) Field of Classification Search
CPC ............. F28D 15/0275; F28D 15/0241; F28D 15/025; F28D 15/0266; F28F 2215/08
See application file for complete search history.

(56) References Cited

U.S. PATENT DOCUMENTS

| 8,422,218 B2 * | 4/2013 | Fried .................. H05K 7/20809 361/695 |
| 8,960,267 B2 | 2/2015 | Huang |
| 2004/0037039 A1 | 2/2004 | Shimura et al. |

(Continued)

FOREIGN PATENT DOCUMENTS

| JP | 2004096074 A | 3/2004 |
| JP | 2008535278 A | 8/2008 |

(Continued)

OTHER PUBLICATIONS

English translation of Notice of Reasons for Refusal received in JP Application No. 2019-513466 dated Jun. 17, 2019.

(Continued)

*Primary Examiner* — Jon T. Schermerhorn, Jr.
(74) *Attorney, Agent, or Firm* — Dorsey & Whitney LLP

(57) ABSTRACT

Provided herein is an example heat sink including a heat dissipation unit including a plurality of heat dissipation fin groups including a plurality of heat dissipation fins, the plurality of heat dissipation fin groups forming a laminated structure and a plurality of heat pipes, one end portions of which are thermally connected to a heating element and other end portions of which are inserted into a space provided between the plurality of heat dissipation fin groups forming the laminated structure and thermally connected to the heat dissipation unit.

10 Claims, 4 Drawing Sheets

(56) References Cited

U.S. PATENT DOCUMENTS

| | | | |
|---|---|---|---|
| 2006/0227506 A1* | 10/2006 | Lee | H01L 23/467 |
| | | | 257/E23.099 |
| 2008/0094798 A1 | 4/2008 | Lee et al. | |
| 2008/0123298 A1* | 5/2008 | Takeguchi | G06F 1/203 |
| | | | 165/80.2 |
| 2008/0210404 A1* | 9/2008 | Peng | H01L 23/427 |
| | | | 165/80.3 |
| 2009/0168331 A1* | 7/2009 | Fujiwara | G06F 1/203 |
| | | | 361/679.47 |
| 2009/0195988 A1* | 8/2009 | Hongo | G06F 1/203 |
| | | | 361/709 |
| 2009/0236076 A1* | 9/2009 | Min | F28D 15/0275 |
| | | | 165/151 |
| 2010/0073880 A1* | 3/2010 | Liu | F28D 15/0275 |
| | | | 361/700 |
| 2012/0279688 A1* | 11/2012 | Wong | H01L 23/34 |
| | | | 165/121 |
| 2013/0014920 A1* | 1/2013 | Chao | F28D 15/0275 |
| | | | 165/185 |
| 2016/0018139 A1* | 1/2016 | Olsson | F25B 21/02 |
| | | | 62/3.3 |
| 2017/0284738 A1 | 10/2017 | Watanabe | |
| 2018/0063994 A1* | 3/2018 | Wu | H05K 7/20409 |
| 2018/0128552 A1* | 5/2018 | Ito | F28D 15/02 |

FOREIGN PATENT DOCUMENTS

| | | |
|---|---|---|
| JP | 3182697 U | 3/2013 |
| JP | 2017020742 A | 1/2017 |
| JP | 2017187269 A | 10/2017 |

OTHER PUBLICATIONS

International Search Report and Written Opinion received in PCT Application No. PCT/JP2019/003084 dated Apr. 9, 2019 (Eng. Translation of ISR only).

English translation of International Preliminary Report on Patentability for Application No. PCT/JP2019/003084, dated Aug. 4, 2020.

English translation of Written Opinion for Application No. PCT/JP2019/003084, dated Apr. 9, 2019.

* cited by examiner

HEAT SINK

CROSS REFERENCE TO RELATED APPLICATIONS

The present application is a continuation application of International Patent Application No. PCT/JP2019/003084 filed on Jan. 30, 2019, which claims the benefit of Japanese Patent Application No. 2018-015334, filed on Jan. 31, 2018. The contents of these applications are incorporated herein by reference in their entirety.

BACKGROUND

Technical Field

The present disclosure relates to a heat sink that cools a heating element.

Background

As electronic apparatuses are provided with increasingly higher functions, heating elements such as electronic parts are mounted in a high density inside the electronic apparatuses. Heat sinks may be used as units configured to cool heating elements such as electronic parts. As the above-described heat sink, for example, a fin integrated heat sink is available, which is provided with a base plate, a plurality of heat dissipation fins positioned at a heat dissipation fin mounting unit formed on one side of the base plate and mechanically caulked and at least one heat pipe positioned at a heat pipe mounting unit formed on another side of the base plate, periphery of which is caulked (Japanese Patent Application Laid-Open No. 2004-96074).

When a heat sink is installed on a substrate inside a server or the like, cooling is generally performed by forced air cooling using a fan. At this time, besides a heating element to be cooled by the heat sink (object to be cooled) on the substrate, other heating elements such as many electronic parts may be present on the substrate upstream of cooling air with respect to the object to be cooled. Since electronic parts or the like other than the heating element to be cooled by the heat sink are also mounted on the substrate like the heating element to be cooled by the heat sink, a temperature of air around a place close to the substrate rises by exchanging heat with other heating elements located upstream of the cooling air with respect to the object to be cooled by the heat sink compared to air around a place far from the substrate.

Therefore, when a heating element is cooled by forced air cooling using a fan, the temperature of the cooling air around an area far from the substrate is low, but high around an area close to the substrate, and so temperature unevenness occurs in a height direction of the cooling air (direction substantially orthogonal to a flow direction of the cooling air). As described in Japanese Patent Application Laid-Open No. 2004-96074, in the case of a heat sink in which a heat pipe extends in an extending direction of a base plate on which heat dissipation fins are disposed upright, if the above-described temperature unevenness occurs in the height direction of the cooling air, heat dissipation deteriorates in an area close to the base plate compared to an area far from the base plate, resulting in a situation in which heat dissipation characteristics of the heat sink deteriorate.

The present disclosure is related to providing a heat sink capable of showing excellent cooling performance on an object to be cooled even when cooling air has a higher temperature in an area close to a substrate than in an area far from the substrate.

SUMMARY

In accordance with one aspect of the present disclosure, a heat sink includes a heat dissipation unit provided with a heat dissipation fin group including a plurality of heat dissipation fins and a heat pipe, one end portion of which is thermally connected to a heating element and another end portion of which is thermally connected to the heat dissipation unit, in which the other end portion of the heat pipe is thermally connected to the heat dissipation unit at a position higher than an installation surface of the heating element in a height direction of the heat dissipation fin group and the heat dissipation fin group is provided at a position higher than the installation surface of the heating element in the height direction of the heat dissipation fin group.

In the above-described aspect, the heat dissipation fin group is positioned and the other end portion of the heat pipe is disposed at a high position in the height direction of the heat dissipation fin group that is supplied with cooling air, which is less affected by a temperature rise of the other heating element. Note that the "height direction of the heat dissipation fin group" in the present specification means a standing direction of a main surface of the heat dissipation fins.

In the heat sink according to the present disclosure, the plurality of heat dissipation fin groups are provided at different positions in the height direction of the heat dissipation fin group, the other end portion of at least one predetermined heat pipe among the plurality of heat pipes is thermally connected to the heat dissipation fin group formed at a highest position in the height direction of the heat dissipation fin group, the other end portions of the heat pipes other than the predetermined heat pipe among the plurality of heat pipes are thermally connected to the heat dissipation fin group formed at a low position in the height direction of the heat dissipation fin group than the heat dissipation fin group to which the other end portion of the predetermined heat pipe is thermally connected.

In accordance with another aspect of the present disclosure, a heat sink includes a heat dissipation unit provided with a plurality of heat dissipation fin groups including a plurality of heat dissipation fins with the plurality of heat dissipation fin groups forming a laminated structure, a plurality of heat pipes, one end portions of which are thermally connected to a heating element and other end portions of which are inserted into spaces provided among the plurality of heat dissipation fin groups that form the laminated structure and thermally connected to the heat dissipation unit, in which another end portion of at least one predetermined heat pipe among the plurality of heat pipes is inserted into the space formed at a highest position in the height direction of the heat dissipation unit and other end portions of the heat pipes other than the predetermined heat pipe among the plurality of heat pipes are inserted into the space formed at a lower position in the height direction of the heat dissipation unit than the space into which the other end portion of the predetermined heat pipe is inserted.

In the above-described aspect, in the heat dissipation unit, other heat pipes are disposed at lower positions in the height direction of the heat dissipation unit supplied with cooling air heated by the other heating elements other than the objects to be cooled by the heat sink and the predetermined heat pipe is disposed at a higher position in the height direction of the heat dissipation unit supplied with cooling air, which is less affected by the temperature rise by the other heating elements. Note that the "height direction of the heat dissipation unit" in the present specification means a laminating direction of the heat dissipation fin groups, the "higher position in the height direction of the heat dissipation unit" means a position far from the heating element, which is an object to be cooled, and the "lower position in the height direction of the heat dissipation unit" means a position close to the heating element, which is an object to be cooled.

In accordance with a further aspect of the present disclosure, a heat sink is provided in which one end portion of the predetermined heat pipe is thermally connected to a region where heat density of the heating element is higher than heat density of the one end portions of the other heat pipes. Note that the "region of the heating element having higher heat density" in the present specification means a region on an outer surface of the heating element having a temperature higher than an average temperature of the entire outer surface of the heating element.

In accordance with a further aspect of the present disclosure, a heat sink is provided in which the heat dissipation unit is provided with at least a first heat dissipation fin group including a plurality of first heat dissipation fins, a second heat dissipation fin group including a plurality of second heat dissipation fins and a third heat dissipation fin group including a plurality of third heat dissipation fins, the first heat dissipation fin group, the second heat dissipation fin group and the third heat dissipation fin group form the laminated structure by the second heat dissipation fin group facing the first heat dissipation fin group via the predetermined heat pipe, and the second heat dissipation fin group facing the third heat dissipation fin group via the other heat pipes.

In accordance with a further aspect of the present disclosure, a heat sink is provided in which the plurality of heat pipes are introduced from an opening side formed between the plurality of heat dissipation fins.

In accordance with a further aspect of the present disclosure, a heat sink is provided in which the predetermined heat pipe is introduced from an opening side formed between the first heat dissipation fins.

In accordance with a further aspect of the present disclosure, a heat sink is provided in which the other heat pipes are introduced from an opening side formed between the second heat dissipation fins.

In accordance with a further aspect of the present disclosure, a heat sink is provided in which bent portions are formed in parts of the plurality of heat pipes thermally connected to the heat dissipation unit.

In accordance with a further aspect of the present disclosure, a heat sink is provided in which the parts of the plurality of heat pipes thermally connected to the heat dissipation unit are processed into a flat shape.

In accordance with a further aspect of the present disclosure, a heat sink is provided in which one end portion of the predetermined heat pipe and one end portions of the other heat pipes are disposed in parallel, thus the plurality of heat pipes forming heat pipe groups.

In accordance with a further aspect of the present disclosure, a heat sink is provided in which one of the heat pipe groups is thermally connected to one of the heating element.

In accordance with a further aspect of the present disclosure, a heat sink is provided in which one or two of the heat pipe groups is/are provided.

In the present disclosure, the other end portion of the heat pipe is thermally connected to the heat dissipation unit at a position higher than an installation surface of the heating element in a height direction of the heat dissipation fin group and the heat dissipation fin group is provided at a position higher than the installation surface of the heating element in the height direction of the heat dissipation fin group, and so even when the cooling air supplied to the heat dissipation unit has a higher temperature at a lower position than at a higher position in the height direction of the heat dissipation unit, the heat pipe is thermally connected to the region of the heat dissipation unit supplied with cooling air having a low temperature. Therefore, since the heat pipe can show great heat transportation performance, it is possible to show excellent cooling performance on an object to be cooled.

In the present disclosure, in the heat dissipation unit in which the plurality of heat dissipation fin groups are disposed at different positions in the height direction of the heat dissipation fin group, at least one predetermined heat pipe is disposed at a high position and the other heat pipes are disposed at positions lower than the predetermined heat pipe, and therefore even when the cooling air supplied to the heat dissipation unit has a higher temperature at a low position than at a high position in the height direction of the heat dissipation unit, the predetermined heat pipe is thermally connected to the region of the heat dissipation unit supplied with cooling air having a low temperature. Therefore, since the predetermined heat pipe can show great heat transportation performance, it is possible to show excellent cooling performance on an object to be cooled.

According to the aspect of the present disclosure, at least one predetermined heat pipe among the plurality of heat pipes is disposed at a high position of the heat dissipation unit in which the heat dissipation fin group forms a laminated structure and the other heat pipes are disposed at positions lower than the predetermined heat pipe, and therefore even when the cooling air supplied to the heat dissipation unit has a higher temperature at a low position than at a high position in the height direction of the heat dissipation unit, the predetermined heat pipe is thermally connected to the region of the heat dissipation unit supplied with cooling air having a low temperature. Therefore, since the predetermined heat pipe can show great heat transportation performance, it is possible to show excellent cooling performance on an object to be cooled.

According to the aspect of the present disclosure, the one end portion of the predetermined heat pipe is thermally connected to a region of the heating element having higher heat density than the one end portions of the other heat pipes, and therefore since the predetermined heat pipe can reliably show great heat transportation performance, it is possible to show more reliable cooling performance on an object to be cooled.

According to the aspect of the present disclosure, the second heat dissipation fin group faces the first heat dissipation fin group via the predetermined heat pipe, the second heat dissipation fin group faces the third heat dissipation fin group via the other heat pipes, and therefore even when a thermal load of the first heat dissipation fin group is different from a thermal load of the third heat dissipation fin group, the second heat dissipation fin group can receive heat from a heat pipe thermally connected to the heat dissipation fin group, which has been given a relatively large thermal load among the first heat dissipation fin group and the third heat dissipation fin group. Therefore, the thermal loads of the first heat dissipation fin group and the third heat dissipation fin group can be made uniform. Therefore, the second heat dissipation fin group can emit more heat from a heat pipe thermally connected to the heat dissipation fin group, which has been given a relatively large thermal load. According to the aspect of the present disclosure, the second heat dissipation fin group can emit more heat from the heat pipe thermally connected to the heat dissipation fin group, which has been given a relatively large thermal load and can consequently facilitate cooling of the heating element, and can thereby extend reliability of the heating element.

According to the aspect of the present disclosure, the heat pipes are introduced from the opening sides formed between the plurality of heat dissipation fins, and it is thereby possible to cool not only the other end portions of the heat pipes thermally connected to the heat dissipation unit and the heat dissipation unit but also the central parts of the heat pipes with cooling air sent in a direction substantially parallel to the surface of the heat dissipation fins. Therefore, cooling performance of the heat sink further improves.

According to the aspect of the present disclosure, since the bent portions are formed at parts of the heat pipes thermally connected to the heat dissipation unit, it is possible to reduce the size of the heat pipes in the longitudinal axis direction and thermally connect the heat pipes to the plurality of heat dissipation fins that form the heat dissipation fin group respectively.

According to the aspect of the present disclosure, since the parts of the heat pipes thermally connected to the heat dissipation unit are processed into a flat shape, the area of contact between the heat dissipation unit and the heat pipes increases, and cooling efficiency can be thereby improved. The above-described flattening process can reduce pressure loss of the cooling air in the heat dissipation unit.

DETAILED DESCRIPTION

Figure 1:
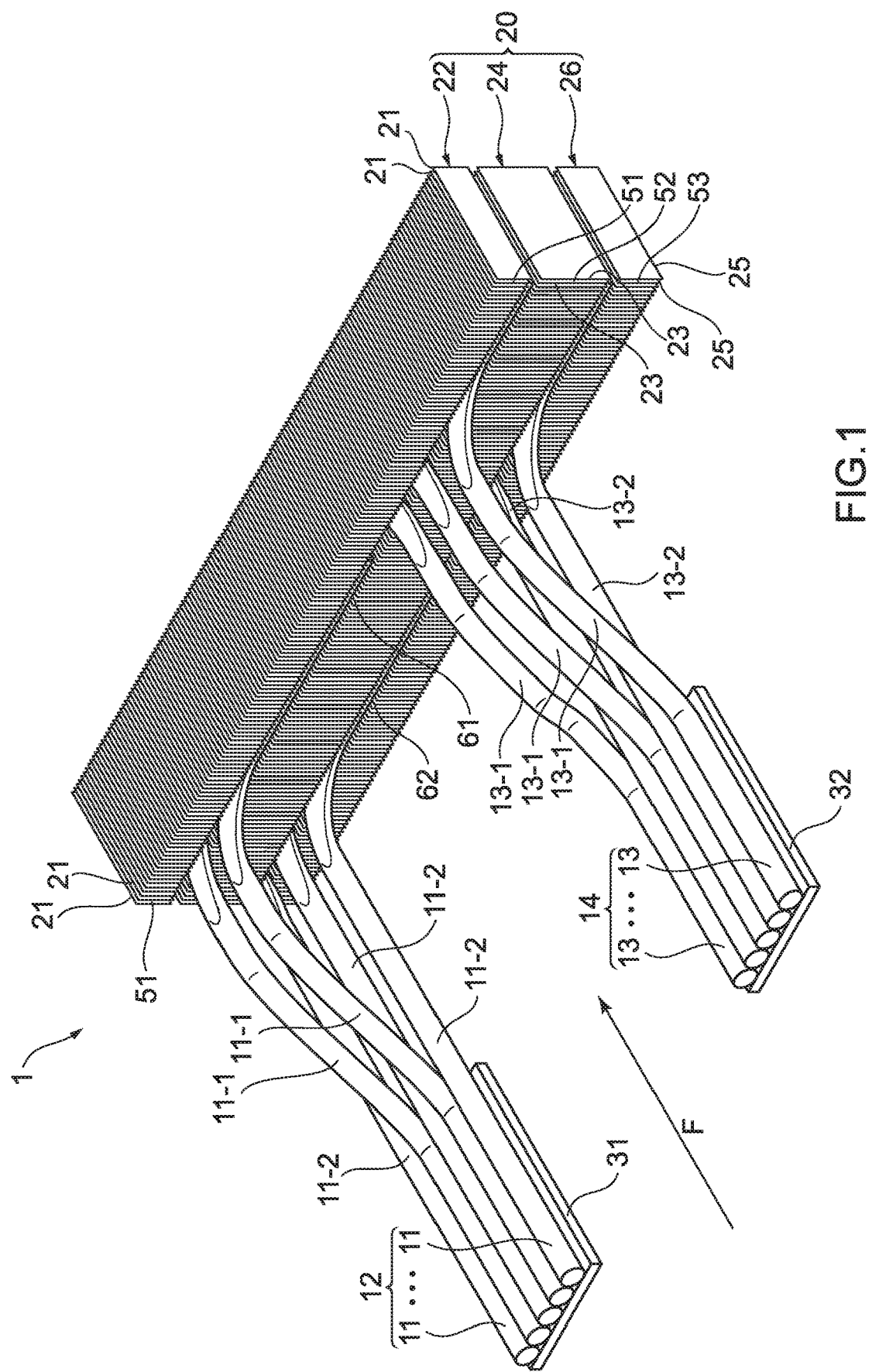
FIG. 1 is a perspective view of a heat sink according to a first embodiment of the present disclosure.

Hereinafter, a heat sink according to a first embodiment of the present disclosure will be described with reference to the accompanying drawings. As shown in FIG. 1, a heat sink 1 according to the first embodiment is provided with first heat pipes 11 thermally connected to a first heating element (not shown) via a first heat receiving plate 31 and second heat pipes 13 thermally connected to a second heating element (not shown) via a second heat receiving plate 32. Both of the first heat pipes 11 and the second heat pipes 13 are thermally connected to a common heat dissipation unit 20 of the heat sink 1. The heat dissipation unit 20 is provided with a first heat dissipation fin group 22, a second heat dissipation fin group 24 and a third heat dissipation fin group 26.

In FIG. 1, the first heat dissipation fin group 22, the second heat dissipation fin group 24 and the third heat dissipation fin group 26 are laminated in a height direction of the heat dissipation unit 20. That is, the heat dissipation unit 20 has a laminated structure composed of a plurality of heat dissipation fin groups. Among the first heat dissipation fin group 22, the second heat dissipation fin group 24 and the third heat dissipation fin group 26, the first heat dissipation fin group 22 is located at an upwardly farthest position with respect to the installation surface of the heating element, that is, at a highest position in the height direction of the heat dissipation unit 20. On the other hand, the third heat dissipation fin group 26 is located at a closest position with respect to the installation surface of the heating element, that is, at a lowest position in the height direction of the heat dissipation unit 20.

A first space 61 is provided between the first heat dissipation fin group 22 and the second heat dissipation fin group 24. A second space 62 is provided between the second heat dissipation fin group 24 and the third heat dissipation fin group 26. Therefore, the first space 61 is provided at a position higher than the second space 62 in the height direction of the heat dissipation unit 20.

As shown in FIG. 1, a plurality of (five in FIG. 1) first heat pipes 11 are disposed in parallel in a direction substantially orthogonal to a longitudinal axis direction, forming a first heat pipe group 12. All the plurality of neighboring first heat pipes 11 are disposed so as to laterally face each other. One end portions of all the plurality of first heat pipes 11 are thermally connected to the first heating element, and the one end portions of the first heat pipe group 12 are thereby thermally connected to the first heating element. In the heat sink 1, the one end portions of the first heat pipe group 12 are indirectly contacted with the surface of the first heating element via the first heat receiving plate 31 to thereby thermally connect the one end portions of the first heat pipe group 12 to the first heating element.

Among the plurality of first heat pipes 11, other end portions of predetermined first heat pipes 11-1 (two pipes in FIG. 1) are thermally connected to the first heat dissipation fin group 22 and the second heat dissipation fin group 24. In the heat sink 1, the other end portions of the predetermined first heat pipes 11-1 are inserted into the first space 61 provided between the first heat dissipation fin group 22 and the second heat dissipation fin group 24, and the other end portions of the predetermined first heat pipes 11-1 are thereby thermally connected to the first heat dissipation fin group 22 and the second heat dissipation fin group 24. Furthermore, among the plurality of first heat pipes 11, other end portions of other first heat pipes 11-2, which are not the predetermined first heat pipes 11-1 (three heat pipes in FIG. 1) are thermally connected to the second heat dissipation fin group 24 and the third heat dissipation fin group 26. In the heat sink 1, the other end portions of the other first heat pipes 11-2 are inserted into the second space 62 provided between the second heat dissipation fin group 24 and the third heat dissipation fin group 26, and the other end portions of the other first heat pipes 11-2 are thereby thermally connected to the second heat dissipation fin group 24 and the third heat dissipation fin group 26.

Figure 2:
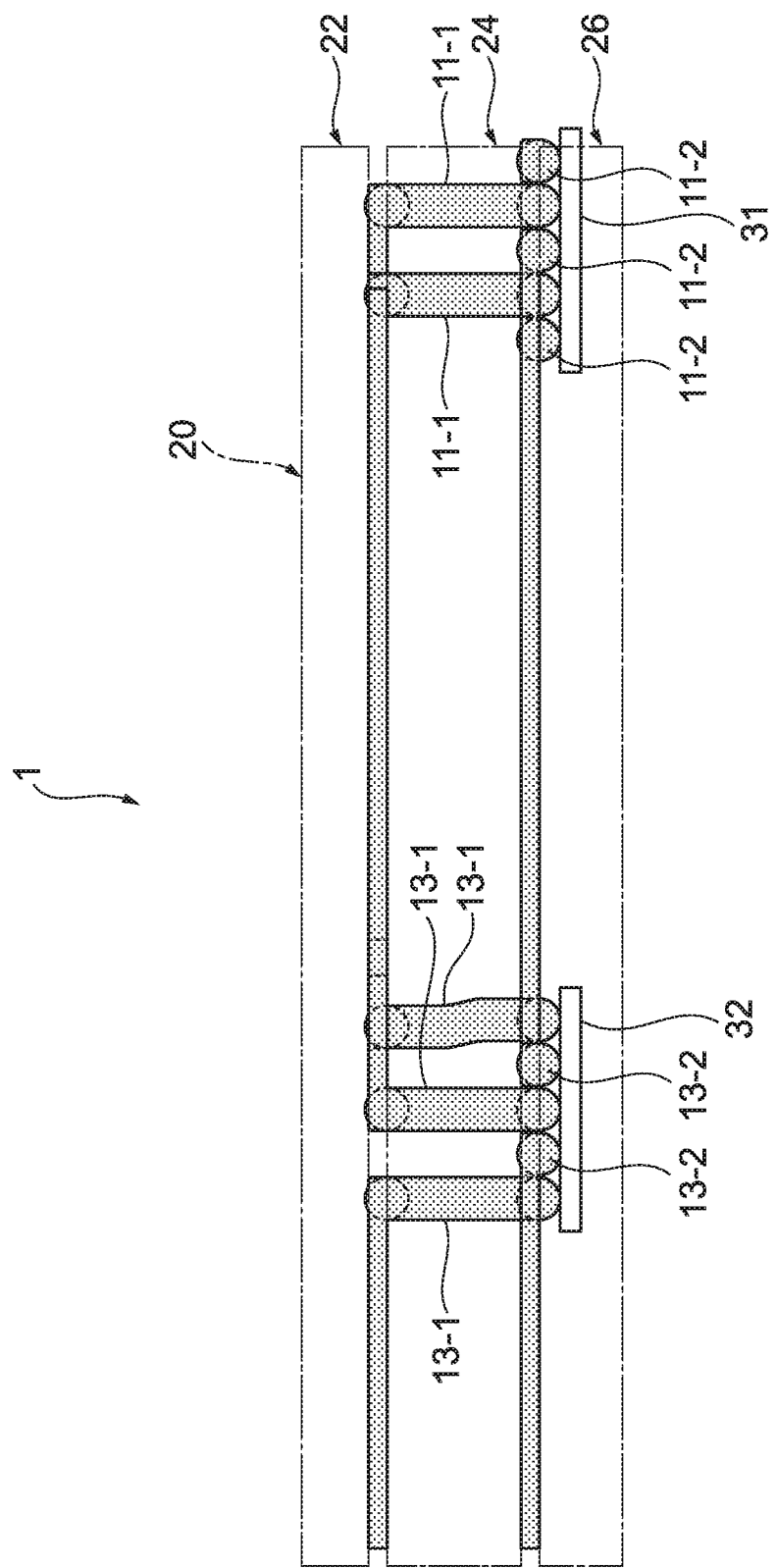
FIG. 2 is an explanatory view of a front of the heat sink according to the first embodiment of the present disclosure.

That is, as shown in FIGS. 1 and 2, among the plurality of first heat pipes 11, some of the first heat pipes (predetermined first heat pipes 11-1) are thermally connected to the heat dissipation unit 20 at a higher position in the height direction of the heat dissipation unit 20 and the other first heat pipes (other first heat pipes 11-2) are thermally connected to the heat dissipation unit 20 at a lower position in the height direction of the heat dissipation unit 20. In the heat sink 1, the predetermined first heat pipes 11-1 and the other first heat pipes 11-2 are alternately disposed.

As shown in FIG. 1, a plurality of (five in FIG. 1) second heat pipes 13 are disposed in parallel in a direction substantially orthogonal to the longitudinal axis direction, forming a second heat pipe group 14. All the plurality of second heat pipes 13 are disposed so as to laterally face each other. One end portions of all the plurality of second heat pipes 13 are thermally connected to the second heating element, and the one end portions of the second heat pipe group 14 are thereby thermally connected to the second heating element. In the heat sink 1, the one end portions of the second heat pipe group 14 are indirectly contacted with the surface of the second heating element via the second heat receiving plate 32 to thereby thermally connect the one end portions of the second heat pipe group 14 to the second heating element.

Among the plurality of second heat pipes 13, other end portions of predetermined second heat pipes 13-1 (three heat pipes in FIG. 1) are thermally connected to the first heat dissipation fin group 22 and the second heat dissipation fin group 24. In the heat sink 1, the other end portions of the predetermined second heat pipes 13-1 are inserted into the first space 61 provided between the first heat dissipation fin group 22 and the second heat dissipation fin group 24, and the other end portions of the predetermined second heat pipes 13-1 are thereby thermally connected to the first heat dissipation fin group 22 and the second heat dissipation fin group 24. Furthermore, among the plurality of second heat pipes 13, other end portions of other second heat pipes 13-2, which are not the predetermined second heat pipes 13-1 (two pipes in FIG. 1) are thermally connected to the second heat dissipation fin group 24 and the third heat dissipation fin group 26. In the heat sink 1, the other end portions of the other second heat pipes 13-2 are inserted into the second space 62 provided between the second heat dissipation fin group 24 and the third heat dissipation fin group 26, and the other end portions of the other second heat pipes 13-2 are thereby thermally connected to the second heat dissipation fin group 24 and the third heat dissipation fin group 26.

That is, as shown in FIGS. 1 and 2, among the plurality of second heat pipes 13, some of the second heat pipes (predetermined second heat pipes 13-1) are thermally connected to the heat dissipation unit 20 at a higher position in the height direction of the heat dissipation unit 20 and the other second heat pipes (other second heat pipes 13-2) are thermally connected to the heat dissipation unit 20 at a lower position in the height direction of the heat dissipation unit 20. In the heat sink 1, the predetermined second heat pipes 13-1 and the other second heat pipes 13-2 are alternately disposed.

Among the first heat pipes 11, the predetermined first heat pipes 11-1 receive heat emitted from the first heating element via the first heat receiving plate 31 at one end portions and transport the heat from the one end portions to the other end portions of the predetermined first heat pipes 11-1. The heat transported to the other end portions of the predetermined first heat pipes 11-1 is transmitted from the other end portions to the first heat dissipation fin group 22 and the second heat dissipation fin group 24 thermally connected to the other end portions. The other first heat pipes 11-2 receive the heat emitted from the first heating element via the first heat receiving plate 31 at the one end portions and transport the heat from the one end portions to the other end portions of the other first heat pipes 11-2. The heat transported to the other end portions of the other first heat pipes 11-2 is transmitted from the other end portions to the second heat dissipation fin group 24 and the third heat dissipation fin group 26 thermally connected to the other end portions. The heat transported from the first heating element to the heat dissipation unit 20 via the first heat pipes 11 is emitted to the outside from the heat dissipation unit 20.

Among the second heat pipes 13, the predetermined second heat pipes 13-1 receive heat emitted from the second heating element via the second heat receiving plate 32 at one end portions and transport the heat from the one end portions to the other end portions of the predetermined second heat pipes 13-1. The heat transported to the other end portions of the predetermined second heat pipes 134 is transmitted from the other end portions to the first heat dissipation fin group 22 and the second heat dissipation fin group 24 thermally connected to the other end portions. The other second heat pipes 13-2 receive the heat emitted from the second heating element via the second heat receiving plate 32 at the one end portions and transport the heat from the one end portions to the other end portions of the other second heat pipes 13-2. The heat transported to the other end portions of the other second heat pipes 13-2 is transmitted from the other end portions to the second heat dissipation fin group 24 and the third heat dissipation fin group 26 thermally connected to the other end portions. The heat transported from the second heating element to the heat dissipation unit 20 via the second heat pipes 13 is emitted to the outside from the heat dissipation unit 20.

As shown in FIG. 1, containers of the first heat pipes 11 and containers of the second heat pipes 13 in the heat sink 1 are tube members, cross-sections in a diameter direction of which are substantially circular. In order to improve thermal connectivity at the heat receiving portion of the first heat pipes 11, the first heat receiving plate 31 is provided between the first heat pipe group 12 and the first heating element. In order to improve thermal connectivity at the heat receiving portion of the second heat pipes 13, the second heat receiving plate 32 is provided between the second heat pipe group 14 and the second heating element.

In correspondence with the fact that the first heating element and the second heating element are disposed on substantially the same plane, the heat receiving portion of the first heat pipe group 12 and the heat receiving portion of the second heat pipe group 14 in the heat sink 1 are disposed on substantially the same plane.

As described above, the other end portion of each first heat pipe 11 is thermally connected to the heat dissipation unit 20, and the other end portion of the first heat pipe group 12 is thereby thermally connected to the heat dissipation unit 20. The other end portion of each second heat pipe 13 is thermally connected to the heat dissipation unit 20, and the other end portion of the second heat pipe group 14 is thereby thermally connected to the heat dissipation unit 20. All regions (central parts) between the one end portions and the other end portions of the first heat pipe group 12 and the second heat pipe group 14 have linear shapes in a plan view.

As shown in FIG. 1, the heat dissipation unit 20, an external shape of which is a substantially rectangular parallelepiped, is provided with the first heat dissipation fin group 22, an external shape of which is a substantially rectangular parallelepiped, the second heat dissipation fin group 24 adjacent to the first heat dissipation fin group 22 and, an external shape of which is a substantially rectangular parallelepiped and the third heat dissipation fin group 26 adjacent to the second heat dissipation fin group 24 and, an external shape of which is a substantially rectangular parallelepiped. Furthermore, the first heat dissipation fin group 22, the second heat dissipation fin group 24 and the third heat dissipation fin group 26 are laminated one on another. That is, the heat dissipation unit 20 in the heat sink 1 has a multilayer structure including a plurality of heat dissipation fin groups laminated one on another, and since the heat dissipation unit 20 in the heat sink 1 includes three heat dissipation fin groups, the heat dissipation unit 20 has a three-layer laminated structure.

The first heat dissipation fin group 22 is provided with a plurality of first heat dissipation fins 21. The first heat dissipation fins 21 are disposed in parallel in a direction substantially parallel to the longitudinal direction of the heat dissipation unit 20. A main surface of each first heat dissipation fin 21 is disposed so as to be substantially parallel to central parts of the first heat pipe group 12 and the second heat pipe group 14, which have a linear shape in a plan view. Therefore, the main surface of each first heat dissipation fin 21 forms transverse directions of the heat dissipation unit 20 and the first heat dissipation fin group 22. The first heat dissipation fin 21 is, for example, a member having a U-shaped cross section with an extending portion (not shown) extending from both upper and lower ends of the main surface and the first heat dissipation fin group 22 can be formed by connecting a locking piece of a distal end of the extending portion to a receiving portion (not shown) of the other neighboring first heat dissipation fin 21 (connected by caulking or the like) or bonding the distal end of the extending portion to the other neighboring first heat dissipation fin 21 (bonding by soldering or the like).

The second heat dissipation fin group 24 is provided with a plurality of second heat dissipation fins 23. The second heat dissipation fins 23 are disposed in parallel in a direction substantially parallel to the longitudinal direction of the heat dissipation unit 20. Furthermore, a main surface of each second heat dissipation fin 23 is disposed so as to be substantially parallel to central parts of the first heat pipe group 12 and the second heat pipe group 14, which have a linear shape in a plan view. Therefore, the main surface of each second heat dissipation fin 23 forms transverse directions of the heat dissipation unit 20 and the second heat dissipation fin group 24. The second heat dissipation fin 23 is, for example, a member having a U-shaped cross section with an extending portion (not shown) extending from both upper and lower ends of the main surface and the second heat dissipation fin group 24 can be formed by connecting a locking piece of a distal end of the extending portion to a receiving portion (not shown) of the other neighboring second heat dissipation fin 23 (connected by caulking or the like) or bonding the distal end of the extending portion to the other neighboring second heat dissipation fin 23 (bonding by soldering or the like).

In the first heat dissipation fin group 22, a first opening 51 is formed between one first heat dissipation fin 21 and another neighboring first heat dissipation fin 21, and the predetermined first heat pipes 11-1 and the predetermined second heat pipes 13-1 are introduced from the first opening 51 side into the heat dissipation unit 20, that is, between the first heat dissipation fin group 22 and the second heat dissipation fin group 24. In the second heat dissipation fin group 24, a second opening 52 is formed between one second heat dissipation fin 23 and another neighboring second heat dissipation fin 23, and the predetermined first heat pipes 11-1 and the predetermined second heat pipes 13-1 are introduced from the second opening 52 side into the heat dissipation unit 20, that is, between the first heat dissipation fin group 22 and the second heat dissipation fin group 24.

The main surface of each first heat dissipation fin 21 and the main surface of each second heat dissipation fin 23 are disposed in parallel with central parts of the first heat pipe group 12 and the second heat pipe group 14, which have a linear shape in a plan view. Therefore, both the first openings 51 and the second openings 52 are opened parallel to the central parts of the first heat pipe group 12 and the second heat pipe group 14.

Therefore, in the heat sink 1, the predetermined first heat pipes 11-1 and the predetermined second heat pipes 13-1 are introduced into the heat dissipation unit 20 from a direction parallel to the first openings 51 and the second openings 52, that is, from a direction orthogonal to the longitudinal direction of the heat dissipation unit 20.

The third heat dissipation fin group 26 is provided with a plurality of third heat dissipation fins 25. The third heat dissipation fins 25 are disposed in parallel in a direction substantially parallel to the longitudinal direction of the heat dissipation unit 20. A main surface of each third heat dissipation fin 25 is disposed in substantially parallel with central parts of the first heat pipe group 12 and the second heat pipe group 14, which have a linear shape in a plan view. Therefore, the main surface of each third heat dissipation fin 25 forms transverse directions of the heat dissipation unit 20 and the third heat dissipation fin group 26. The third heat dissipation fin 25 is, for example, a member having a U-shaped cross section with an extending portion (not shown) extending from both upper and lower ends of the main surface and the third heat dissipation fin group 26 can be formed by connecting a locking piece of a distal end of the extending portion to a receiving portion (not shown) of the other neighboring third heat dissipation fin 25 (connected by caulking or the like) or bonding the distal end of the extending portion to the other neighboring third heat dissipation fin 25 (bonding by soldering or the like).

In the third heat dissipation fin group 26, a third opening 53 is formed between one third heat dissipation fin 25 and another neighboring third heat dissipation fin 25, and the other first heat pipes 11-2 and the other second heat pipes 13-2 are introduced from the third opening 53 side into the heat dissipation unit 20, that is, between the second heat dissipation fin group 24 and the third heat dissipation fin group 26.

The main surface of each third heat dissipation fin 25 is disposed in parallel with central parts of the first heat pipe group 12 and the second heat pipe group 14, which have a linear shape in a plan view. Therefore, the third opening 53 is also opened in parallel with the central portions of the first heat pipe group 12 and the second heat pipe group 14.

Therefore, in the heat sink 1, the other first heat pipes 11-2 and the other second heat pipes 13-2 are introduced into the heat dissipation unit 20 from a direction parallel to the second openings 52 and the third openings 53, that is, from a direction orthogonal to the longitudinal direction of the heat dissipation unit 20.

Figure 3:
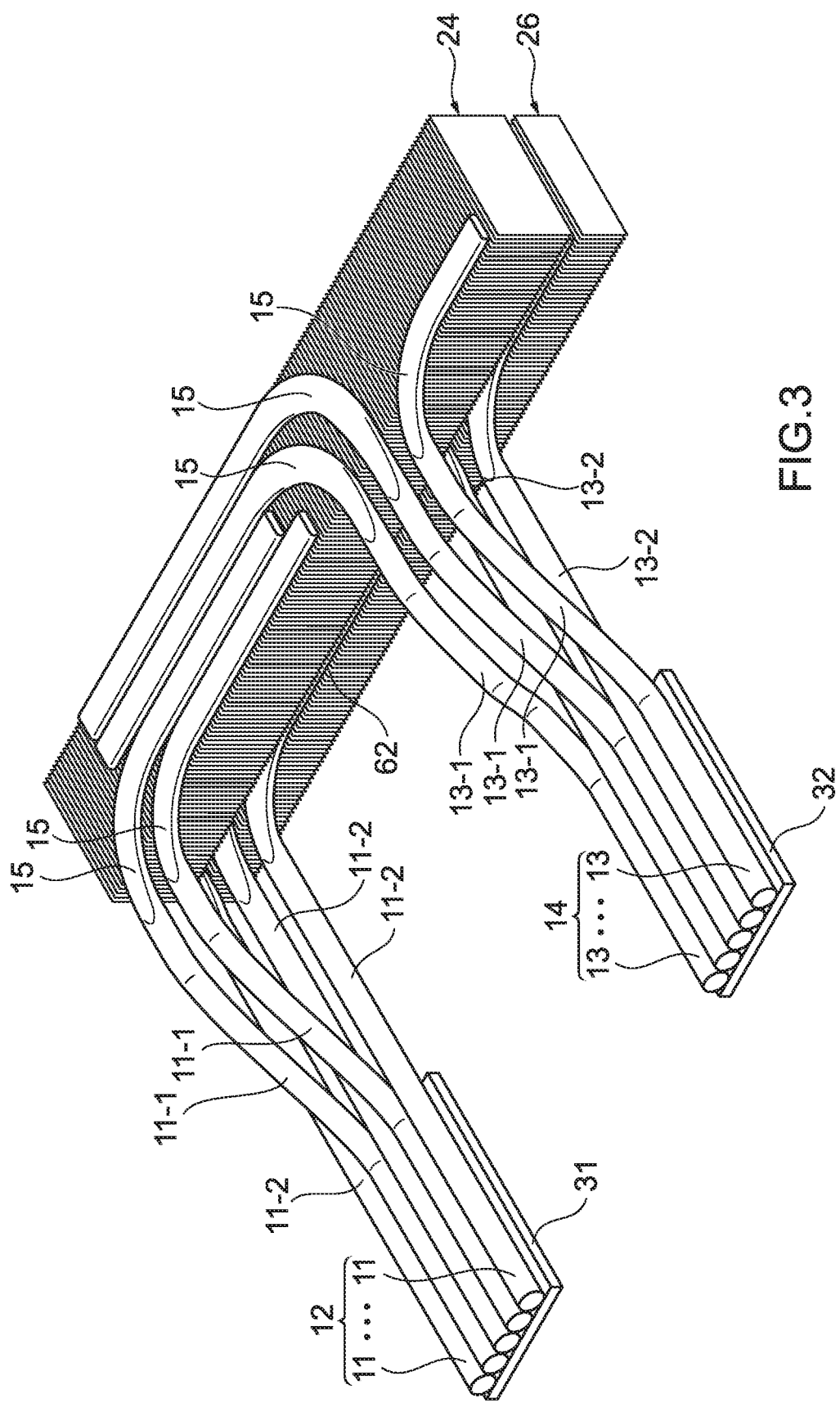
FIG. 3 is an explanatory view of an inside of a heat dissipation unit of the heat sink according to the first embodiment of the present disclosure.

As shown in FIGS. 1 and 3, in the heat sink 1, bent portions 15 are formed in parts of the predetermined first heat pipes 11-1 and the predetermined second heat pipes 13-1 thermally connected to the first heat dissipation fin group 22 and the second heat dissipation fin group 24. Therefore, both the predetermined first heat pipes 11-1 and the predetermined second heat pipes 13-1 are substantially L-shaped in a plan view. The predetermined first heat pipes 11-1 are positioned at a left side of the predetermined second heat pipes 13-1 and both bent portions 15 of the predetermined first heat pipes 11-1 are bent rightward. The two bent portions 15 at a left side of the predetermined second heat pipes 13-1 are bent leftward and one bent portion 15 at a right side is bent rightward. Therefore, as shown in FIG. 3, with the bent portions 15, the other end portions of the predetermined first heat pipes 11-1 and the predetermined second heat pipes 13-1 are configured to extend in substantially parallel with the longitudinal direction of the heat dissipation unit 20.

Though not illustrated, bent portions of the other first heat pipes 11-2 and the other second heat pipes 13-2 are formed in parts thermally connected to the second heat dissipation fin group 24 and the third heat dissipation fin group 26. Therefore, both the other first heat pipes 11-2 and the other second heat pipes 13-2 are substantially L-shaped in a plan view. The other first heat pipes 11-2 are positioned at a left side of the other second heat pipes 13-2 and all the bent portions of the other first heat pipes 11-2 are bent rightward. The one bent portion on the left side of the other second heat pipes 13-2 is bent leftward and the one bent portion on the right side is bent rightward. Thus, with the bent portions, the other end portions of the other first heat pipes 11-2 and the other second heat pipes 13-2 are configured to extend in substantially parallel with the longitudinal direction of the heat dissipation unit 20. Therefore, it is possible to thermally connect the first heat pipes 11 and the second heat pipes 13 to the plurality of heat dissipation fins of the heat dissipation unit 20 while reducing the sizes of the first heat pipes 11 and the second heat pipes 13 in the longitudinal axis direction.

The other end portions of the first heat pipes 11 and the second heat pipes 13 thermally connected to the heat dissipation unit 20 are processed into a flat shape. The flattening process can increase the areas of contact between the heat dissipation unit 20 and the first heat pipes 11 and the second heat pipes 13, and improve cooling efficiency. The flattening process can reduce pressure loss of cooling air F in the heat dissipation unit 20.

Materials of the first heat dissipation fins 21, the second heat dissipation fins 23 and the third heat dissipation fins 25 are not particularly limited, but metals such as copper, copper alloy, aluminum, or aluminum alloy can be taken as examples. Container materials of the first heat pipes 11 and the second heat pipes 13 are not particularly limited, but metals such as copper, copper alloy, aluminum, aluminum alloy or stainless steel can be taken as examples. A method for thermally connecting the first heat dissipation fins 21, the second heat dissipation fins 23 and the third heat dissipation fins 25 to the first heat pipes 11 and the second heat pipes 13 is not particularly limited, but the first heat dissipation fins 21, the second heat dissipation fins 23 and the third heat dissipation fins 25 can be thermally connected to the first heat pipes 11 and the second heat pipes 13 by bonding such as soldering. Examples of working fluid to be sealed in the first heat pipes 11 and the second heat pipes 13 include water, alternative chlorofluorocarbon, perfluorocarbon or cyclopentane.

As described above, in the heat sink 1, among the plurality of first heat pipes 11 thermally connected to the first heating element, the predetermined first heat pipes 11-1 are disposed at high positions of the heat dissipation unit 20 and the other first heat pipes 11-2 are disposed at positions of the heat dissipation unit 20 lower than the predetermined first heat pipes 11-1. Furthermore, among the plurality of second heat pipes 13 thermally connected to the second heating element, the predetermined second heat pipes 13-1 are disposed at high positions of the heat dissipation unit 20 and the other second heat pipes 13-2 are disposed at positions of the heat dissipation unit 20 lower than the predetermined second heat pipes 13-1. Therefore, even when the cooling air F has a higher temperature at a low position in the height direction of the heat dissipation unit 20 than at a high position, the predetermined first heat pipes 11-1 and the predetermined second heat pipes 13-1 thermally connected to the region of the heat dissipation unit 20 supplied with the cooling air F having a low temperature can thereby show great heat transportation performance. In the heat sink 1, the predetermined first heat pipes 11-1 and the predetermined second heat pipes 13-1 show great heat transportation performance, and can thereby show excellent cooling performance on the heating element.

Even when the cooling air F has a higher temperature at the low position in the height direction of the heat dissipation unit 20 than at the high position, the predetermined first heat pipes 11-1 and the predetermined second heat pipes 13-1 show great heat transportation performance, and can thereby uniformly cool each heating element even when a plurality of heating elements are thermally connected to the heat sink 1.

In the heat sink 1, the predetermined first heat pipes 11-1 and the other first heat pipes 11-2 are alternately disposed, heat is thereby uniformly transmitted from the entire first heat receiving plate 31 thermally connected to the first heating element to the first heat pipe group 12. Thus, cooling efficiency with respect to the first heating element improves more in the heat sink 1. Furthermore, since the predetermined second heat pipes 13-1 and the other second heat pipes 13-2 are alternately disposed, heat is thereby uniformly transmitted from the entire second heat receiving plate 32 thermally connected to the second heating element to the second heat pipe group 14. Thus, cooling efficiency with respect to the second heating element improves more in the heat sink 1.

In the heat sink 1, among the plurality of first heat pipes 11, the predetermined first heat pipes 11-1 and the other first heat pipes 11-2 are thermally connected to the heat dissipation unit 20 at different heights, and therefore, compared to a case where all the plurality of first heat pipes 11 are thermally connected to the heat dissipation unit 20 at the same height, the bent portions of the first heat pipes 11 can be accommodated compactly. Similarly, in the heat sink 1, compared to a case where all the plurality of second heat pipes 13 are thermally connected to the heat dissipation unit 20 at the same height, the bent portions of the second heat pipes 13 can be accommodated compactly. Therefore, in the heat sink 1, since space can be saved in the bent portions of the first heat pipes 11 and the second heat pipes 13, the heat sink 1 can be mounted in a housing even when electronic parts or the like are mounted in the housing at high density.

In the heat sink 1, the second heat dissipation fin group 24 faces the first heat dissipation fin group 22 via the predetermined heat pipes and the second heat dissipation fin group 24 faces the third heat dissipation fin group 26 via the other heat pipes, and even when a thermal load of the first heat dissipation fin group 22 differs from a thermal load of the third heat dissipation fin group 26, the second heat dissipation fin group 24 can receive heat from heat pipes thermally connected to the heat dissipation fin group given a relatively large thermal load of the first heat dissipation fin group 22 and the third heat dissipation fin group 26. Therefore, in the heat sink 1, it is possible to uniformize thermal loads of the first heat dissipation fin group 22 and the third heat dissipation fin group 26. As described above, the second heat dissipation fin group 24 can emit more heat from the heat pipes thermally connected to the heat dissipation fin group given a relatively large thermal load. In the heat sink 1, the second heat dissipation fin group can emit more heat from the heat pipes thermally connected to the heat dissipation fin group given a relatively large thermal load, consequently facilitate cooling of the heating element, and thereby extend reliability of the heating element.

In the heat sink 1, since the first heat pipes 11 and the second heat pipes 13 are introduced from the opening side formed between the plurality of heat dissipation fins, is possible to cool not only the other end portions of the first heat pipes 11 and the second heat pipes 13 thermally connected to the heat dissipation unit 20 and the heat dissipation unit 20 but also the central parts of the first heat pipes 11 and the second heat pipes 13 with the cooling air F sent in substantially parallel with the main surfaces of the heat dissipation fins. Therefore, cooling performance of the heat sink 1 further improves.

Next, a heat sink according to a second embodiment of the present disclosure will be described with reference to the accompanying drawings. Note that the same components as the components of the heat sink 1 according to the first embodiment will be described using the same reference numerals.

Figure 4:
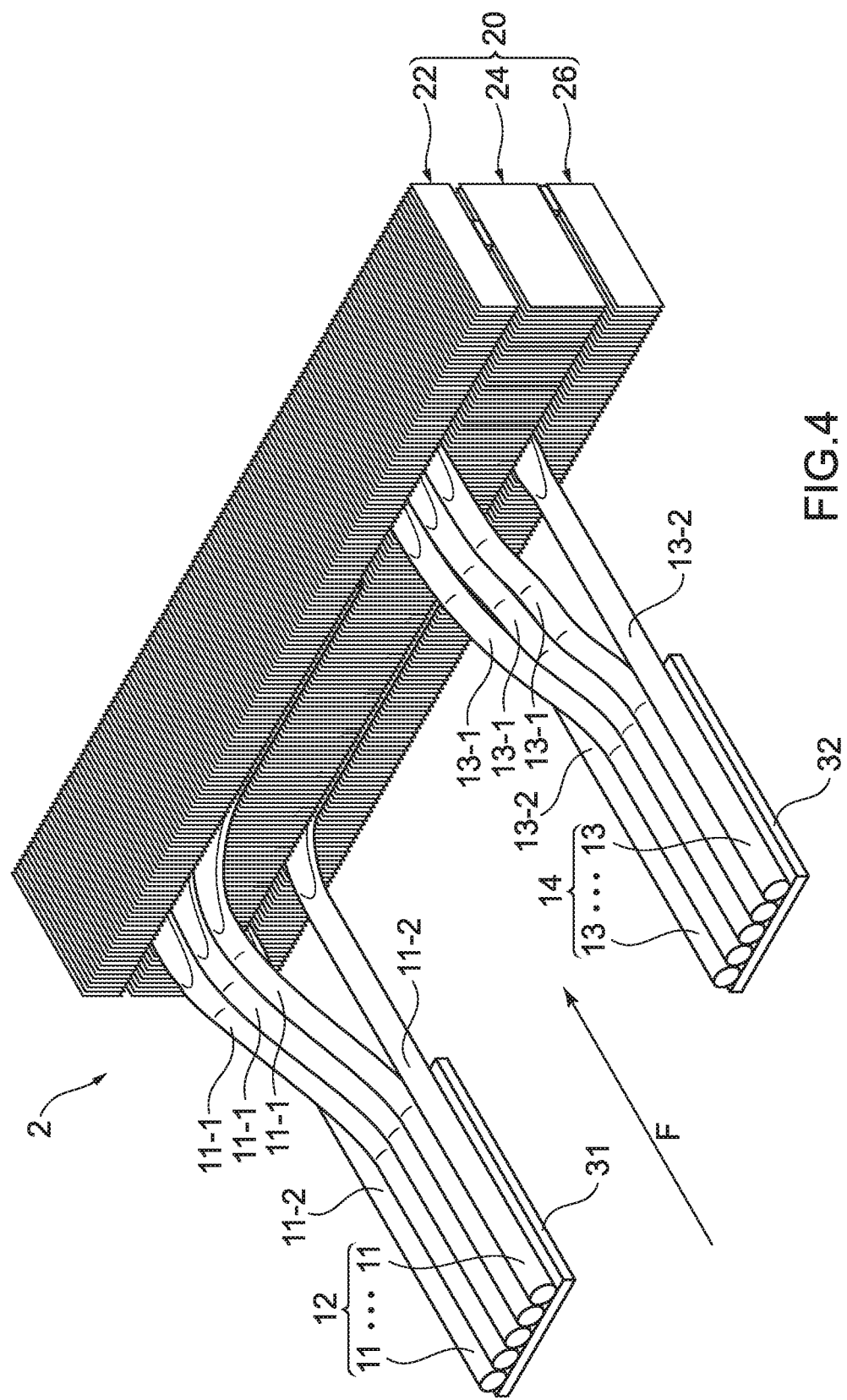
FIG. 4 is a perspective view of a heat sink according to a second embodiment of the present disclosure.

In the heat sink 1 according to the first embodiment, the predetermined first heat pipes 11-1 and the other first heat pipes 11-2 are disposed alternately. Instead of this, as shown in FIG. 4, in a heat sink 2 according to the second embodiment, predetermined first heat pipes 11-1 are disposed in parallel in the central part and other first heat pipes 11-2 are disposed on both sides of the predetermined first heat pipes 11-1. In the heat sink 2, predetermined second heat pipes 13-1 are disposed in parallel in the central part and other second heat pipes 13-2 are disposed on both sides of the predetermined second heat pipes 13-1.

The heat sink 2 can show cooling performance on the heating element more reliably when a region of high heat density (e.g., hot spot) is formed near the central part of the surface of the first heat receiving plate 31 and the surface of the second heat receiving plate 32. That is, the heat sink 2 can show cooling performance on the heating element more reliably in that the one end portions of the predetermined heat pipes showing great heat transportation performance are thermally connected to the region of the heat receiving plate of high heat density than the one end portions of the other heat pipes. Note that the "region of the heat receiving plate of high heat density" means a region at a temperature higher than an average temperature of the entire surface of the surface of the heat receiving plate.

Next, other embodiments of the heat sink of the present disclosure will be described. Although the number of heat pipes forming the first heat pipe group and the second heat pipe group is 5 in the above-described embodiments, the number of heat pipes in each heat pipe group can be selected as appropriate in accordance with a heating value or the like of the heating element as long as the number of heat pipes is plural, such as 2 to 4 or 6 or more. The number of first heat pipes forming the first heat pipe group and the number of second heat pipes forming the second heat pipe group may be the same or different.

Although two heat pipe groups are provided in the above-described embodiments in correspondence with the fact that the number of heating elements is 2, the number of heat pipe groups and the number of heating elements are not particularly limited, and for example, the number may be 1 or 3 or more.

Although the heat dissipation fin groups of the heat dissipation unit in the above-described embodiments have a three-layer structure including three heat dissipation fin groups, the heat dissipation fin groups may have a four-layer structure including four heat dissipation fin groups or a structure having 5 or more layers including 5 or more heat dissipation fin groups. A heat dissipation unit having a 4-layer structure includes 3 spaces provided between neighboring heat dissipation fin groups and a heat dissipation unit having a structure of 5 or more layers includes 4 or more spaces provided between neighboring heat dissipation fin groups. At least one heat pipe out of one heat pipe group may be inserted in the above-described space formed at a highest position in the height direction of the heat dissipation unit. In other words, the number of predetermined heat pipes per heat pipe group may be at least one and at least one heat pipe of at least one of the first heat pipes and the second heat pipes may be inserted in the above-described space at a position other than the highest position.

Although the heat dissipation unit in the above-described embodiments is provided with a plurality of heat dissipation fin groups and a plurality of heat pipes, the number of heat dissipation fin groups may be one or when the number of heat dissipation fin groups is one, the number of heat pipes may be one or plural. In this case, the other end portions of the heat pipes are thermally connected to the heat dissipation unit (heat dissipation fin group) at positions higher than the installation surface of the heating element in the height direction of the heat dissipation fin group and the heat dissipation unit (heat dissipation fin group) is provided at a position higher than the installation surface of the heating element in the height direction of the heat dissipation fin group. That is, the heat dissipation unit (heat dissipation fin group) is provided only at a position higher than the installation surface of the heating element in the height direction of the heat dissipation fin group.

In the above-described aspect, even when the cooling air supplied to the heat dissipation unit has a higher temperature at a low position than at a high position in the height direction of the heat dissipation unit, the heat pipes are thermally connected to the region of the heat dissipation unit supplied with cooling air having a low temperature. Therefore, the heat pipes can show great heat transportation performance, and can thereby show excellent cooling performance on the object to be cooled.

In the above-described embodiments, the heat dissipation unit has a laminated structure including a plurality of heat dissipation fin groups, but the plurality of heat dissipation fin groups are not limited to the formation of the laminated structure, and the plurality of heat dissipation fin groups need only to be provided at different positions, that is, at different heights in the height direction of the heat dissipation fin group. As an aspect in which the plurality of heat dissipation fin groups are provided at different heights without forming the laminated structure, an aspect in which the plurality of heat dissipation fin groups are disposed in a stepwise shape can be taken as an example.

In this case, the other end portion of at least one predetermined heat pipe among the plurality of heat pipes is thermally connected to the heat dissipation fin group formed at a highest position in the height direction of the heat dissipation fin group and the other end portions of the heat pipes other than the predetermined heat pipe among the plurality of heat pipes are thermally connected to the heat dissipation fin group formed at a position in the height direction of the heat dissipation fin group lower than the heat dissipation fin group to which the other end portion of the predetermined heat pipe is thermally connected.

In the above-described aspect, as in the cases of the above-described embodiments, even when the cooling air supplied to the heat dissipation unit has a higher temperature at a low position than at a high position in the height direction of the heat dissipation unit, the predetermined heat pipe is thermally connected to the region of the heat dissipation unit supplied with cooling air having a low temperature. Therefore, the predetermined heat pipe can show great heat transportation performance, and can thereby show excellent cooling performance on the object to be cooled.

While the heat sink of the present disclosure can be used in a wide range of fields, even when unevenness occurs in the temperature of cooling air in the height direction of the heat dissipation unit, the predetermined heat pipe shows great heat transportation performance, and can thereby show excellent cooling performance on the object to be cooled. Therefore, the heat sink of the present disclosure has a high utility value in the field of cooling electronic parts such as arithmetic elements mounted on a server.

What is claimed is:

1. A heat sink comprising:
a heat dissipation unit comprising a plurality of heat dissipation fin groups including a plurality of heat dissipation fins, the plurality of heat dissipation fin groups forming a laminated structure; and
a plurality of heat pipes, each of the heat pipes including a first end portion and a second end portion, the first end portions being thermally connected to a heating element and second end portions being inserted into a space provided between the plurality of heat dissipation fin groups forming the laminated structure and thermally connected to the heat dissipation unit, wherein
the plurality of heat pipes comprise predetermined heat pipes and other heat pipes which are not the predetermined heat pipes,
the second end portion of the predetermined heat pipes are upper second end portions which are
inserted into a first space provided between the plurality of heat dissipation fin groups, the first space being located at a position in a height direction of the heat dissipation unit which is directly below the highest fin group of the plurality of heat dissipation fin groups, and
the second end portions of the other heat pipes are lower second end portions which are inserted into a second space provided between the plurality of heat dissipation fin groups, the second space being located at a position in the height direction of the heat dissipation unit which is lower than the first space,
the first end portions of the predetermined heat pipes and the first end portions of the other heat pipes are alternately disposed.

2. The heat sink according to claim 1, wherein the heat dissipation unit comprises at least a first heat dissipation fin group including a plurality of first heat dissipation fins, a second heat dissipation fin group including a plurality of second heat dissipation fins, and a third heat dissipation fin group including a plurality of third heat dissipation fins, and the first heat dissipation fin group, the second heat dissipation fin group and the third heat dissipation fin group form the laminated structure by the second heat dissipation fin group facing the first heat dissipation fin group via at least one of the predetermined heat pipes, and the second heat dissipation fin group facing the third heat dissipation fin group via the other heat pipes.

3. The heat sink according to claim 1, wherein the plurality of heat pipes are introduced into the first space or the second space from an opening side of the heat dissipation unit, the opening side being a side of the fin groups which has an opening formed between adjacent heat dissipation fins of the plurality of heat dissipation fins.

4. The heat sink according to claim 2, wherein the one predetermined heat pipes are introduced into the first space from an opening side of the heat dissipation unit, the opening side being a side of the first heat dissipation fin groups which has an opening formed between adjacent heat dissipation fins of the plurality of first heat dissipation fins.

5. The heat sink according to claim 2, wherein the other heat pipes are introduced into the second space from an opening side of the heat dissipation unit, the opening side being a side of the second heat dissipation fin groups which has an opening formed between adjacent heat dissipation fins of the plurality of second heat dissipation fins.

6. The heat sink according to claim 1, wherein bent portions are formed in parts of the plurality of heat pipes thermally connected to the heat dissipation unit.

7. The heat sink according to claim 1, wherein parts of the plurality of heat pipes thermally connected to the heat dissipation unit are processed into a flat shape.

8. The heat sink according to claim 1, wherein the plurality of heat pipes form a heat pipe group by the first end portion of the predetermined heat pipes and one the first end portions of the other heat pipes being disposed in parallel in a direction orthogonal to a longitudinal axis of the plurality of heat pipes.

9. The heat sink according to claim 8, wherein the heat pipe groups is thermally connected to the heating element.

10. The heat sink according to claim 1, wherein the plurality of heat dissipation fins, each of the heat dissipation fins including a main surface, the main surfaces are disposed so as to be parallel to a longitudinal axis of the first end portions of the predetermined heat pipes and a longitudinal axis of the first end portions of the other heat pipes.

* * * * *